(12) United States Patent
Sakuma et al.

(10) Patent No.: US 9,318,460 B2
(45) Date of Patent: Apr. 19, 2016

(54) SUBSTRATE AND ASSEMBLY THEREOF WITH DIELECTRIC REMOVAL FOR INCREASED POST HEIGHT

(71) Applicant: Tessera, Inc., San Jose, CA (US)

(72) Inventors: Kazuo Sakuma, Iwaki (JP); Philip Damberg, Cupertino, CA (US); Belgacem Haba, Saratoga, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 14/513,563

(22) Filed: Oct. 14, 2014

(65) Prior Publication Data
US 2015/0028480 A1 Jan. 29, 2015

Related U.S. Application Data

(62) Division of application No. 13/155,845, filed on Jun. 8, 2011, now Pat. No. 8,884,432.

(51) Int. Cl.
*H01L 23/498* (2006.01)
*H01L 23/00* (2006.01)
(Continued)

(52) U.S. Cl.
CPC .......... *H01L 24/17* (2013.01); *H01L 23/49816* (2013.01); *H05K 1/0284* (2013.01); *H05K 1/0306* (2013.01); *H05K 1/09* (2013.01); *H01L 23/498* (2013.01); *H01L 24/01* (2013.01); *H01L 24/15* (2013.01); *H01L 24/16* (2013.01); *H01L 2224/16225* (2013.01); *H01L 2224/16238* (2013.01); *H01L 2224/32225* (2013.01); *H01L 2224/73204* (2013.01);
(Continued)

(58) Field of Classification Search
CPC .................................................. H01L 23/49816
See application file for complete search history.

(56) References Cited

U.S. PATENT DOCUMENTS 4,742,023 A 5/1988 Hasegawa
5,284,797 A 2/1994 Heim
(Continued)

FOREIGN PATENT DOCUMENTS

TW 200721419 6/2007
TW 200901336 A 1/2009

OTHER PUBLICATIONS

International Search Report for Application No. PCT/US2012/041266 dated Oct. 19, 2012.
(Continued)

*Primary Examiner* — William Harriston
(74) *Attorney, Agent, or Firm* — Lerner, David, Littenberg, Krumholz & Mentlik, LLP

(57) ABSTRACT

An interconnection substrate includes a plurality of electrically conductive elements of at least one wiring layer defining first and second lateral directions. Electrically conductive projections for bonding to electrically conductive contacts of at least one component external to the substrate, extend from the conductive elements above the at least one wiring layer. The conductive projections have end portions remote from the conductive elements and neck portions between the conductive elements and the end portions. The end portions have lower surfaces extending outwardly from the neck portions in at least one of the lateral directions. The substrate further includes a dielectric layer overlying the conductive elements and extending upwardly along the neck portions at least to the lower surfaces. At least portions of the dielectric layer between the conductive projections are recessed below a height of the lower surfaces.

18 Claims, 7 Drawing Sheets

(51) Int. Cl.
    *H05K 1/02*                (2006.01)
    *H05K 1/03*                (2006.01)
    *H05K 1/09*                (2006.01)

(52) U.S. Cl.
    CPC ............... *H01L 2224/81192* (2013.01); *H01L 2924/014* (2013.01); *H01L 2924/01013* (2013.01); *H01L 2924/01028* (2013.01); *H01L 2924/01029* (2013.01); *H01L 2924/01079* (2013.01); *H01L 2924/09701* (2013.01); *H01L 2924/12042* (2013.01); *H05K 2201/0166* (2013.01)

(56) References Cited

U.S. PATENT DOCUMENTS

| | | | |
|---|---|---|---|
| 6,228,466 B1 * | 5/2001 | Tsukada et al. | 428/209 |
| 6,564,448 B1 * | 5/2003 | Oura et al. | 29/830 |
| 6,930,390 B2 | 8/2005 | Kaneda et al. | |
| 8,884,432 B2 | 11/2014 | Sakuma et al. | |
| 8,890,304 B2 | 11/2014 | Sato et al. | |
| 2004/0020045 A1 | 2/2004 | Hirano | |
| 2005/0056445 A1 | 3/2005 | Orui et al. | |
| 2008/0112318 A1 | 5/2008 | Groleau et al. | |
| 2008/0194095 A1 | 8/2008 | Daubenspeck et al. | |
| 2010/0071950 A1 | 3/2010 | Ohsumi | |
| 2012/0007230 A1 * | 1/2012 | Hwang et al. | 257/737 |
| 2012/0313239 A1 | 12/2012 | Zohni | |

OTHER PUBLICATIONS

Written Opinion for Application No. PCT/US2012/041266 dated Oct. 19, 2012.

Taiwanese Office Action for Application No. 101120776 dated May 18, 2015.

* cited by examiner

PRIOR ART

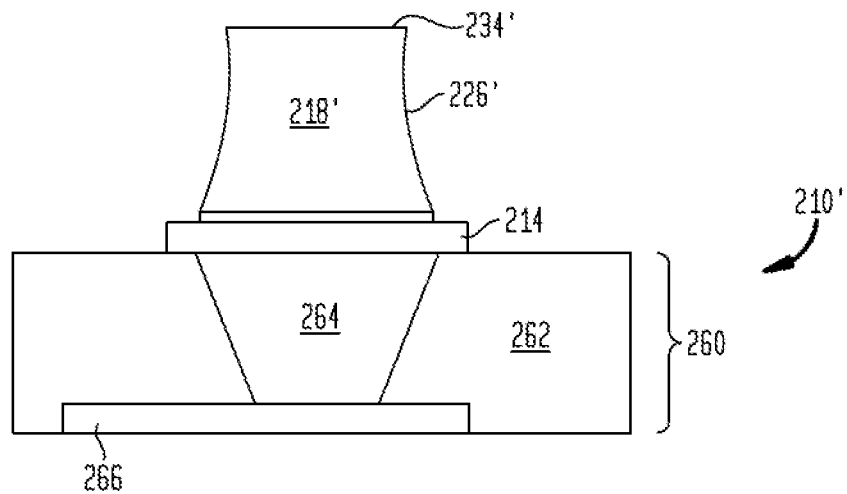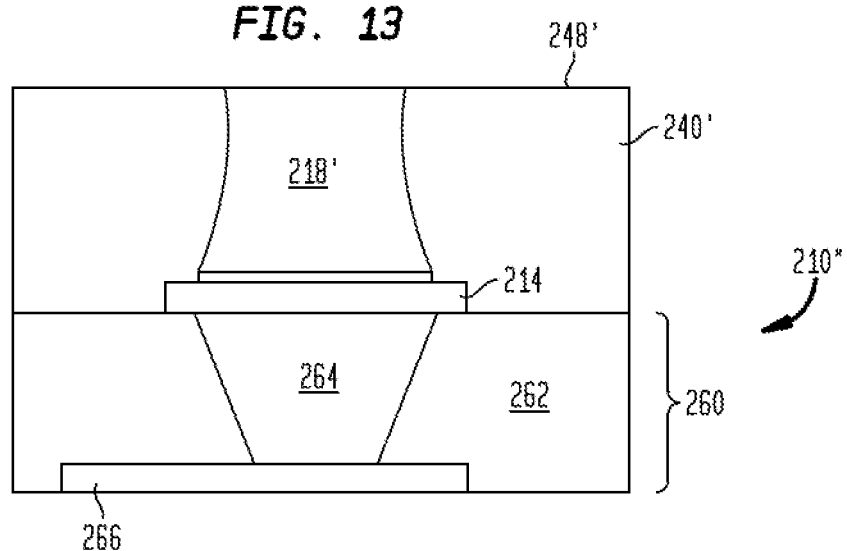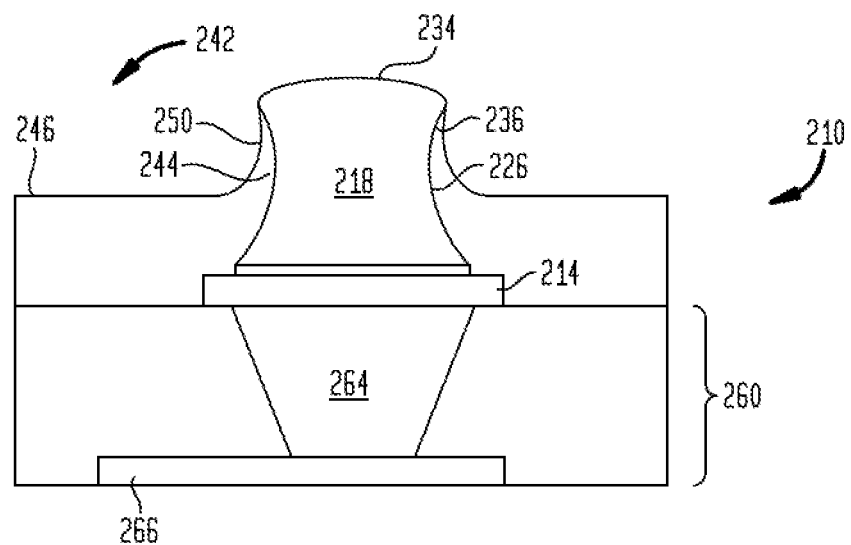

SUBSTRATE AND ASSEMBLY THEREOF WITH DIELECTRIC REMOVAL FOR INCREASED POST HEIGHT

CROSS-REFERENCES TO RELATED APPLICATIONS

The present application is a divisional of U.S. patent application Ser. No. 13/155,845 filed on Jun. 8, 2011, the disclosure of which is incorporated herein by reference.

BACKGROUND OF THE INVENTION

The present invention relates to the art of electronic packaging, and more specifically to assemblies incorporating semiconductor chips and to methods and components useful in making such assemblies.

Many electronic devices utilize semiconductor chips, commonly referred to as "integrated circuits" which incorporate numerous electronic elements. These chips are mounted on substrates which physically support the chips and electrically interconnect each chip with other elements of the circuit. The substrate may be a part of a discrete chip package used to hold a single chip and equipped with terminals for interconnection to external circuit elements. Such substrates may be secured to an external circuit board or chassis. Alternatively, in a so-called "hybrid circuit" one or more chips are mounted directly to a substrate forming a circuit panel arranged to interconnect the chips and the other circuit elements mounted to the substrate. In either case, the chip must be securely held on the substrate and must be provided with reliable electrical interconnection to the substrate. The interconnection between the chip itself and its supporting substrate is commonly referred to as "first level" assembly or chip interconnection, as distinguished from the interconnection between the substrate and the larger elements of the circuit, commonly referred to as a "second level" interconnection.

The structures utilized to provide the first level connection between the chip and the substrate must accommodate all of the required electrical interconnections to the chip. The number of connections to external circuit elements, commonly referred to as "input-output" or "I/O" connections, is determined by the structure and function of the chip. Advanced chips capable of performing numerous functions may require substantial numbers of I/O connections.

First level interconnection structures connecting a chip to a substrate ordinarily are subject to substantial strain caused by thermal cycling as temperatures within the device change during operation. The electrical power dissipated within the chip tends to heat the chip and substrate, so that the temperatures of the chip and substrate rise each time the device is turned on and fall each time the device is turned off. As the chip and the substrate ordinarily are formed from different materials having different coefficients of thermal expansion, the chip and substrate ordinarily expand and contract by different amounts. This causes the electrical contacts on the chip to move relative to the electrical contact pads on the substrate as the temperature of the chip and substrate changes. This relative movement deforms the electrical interconnections between the chip and substrate and places them under mechanical stress. These stresses are applied repeatedly with repeated operation of the device, and can cause breakage of the electrical interconnections. Thermal cycling stresses may occur even where the chip and substrate are formed from like materials having similar coefficients of thermal expansion, because the temperature of the chip may increase more rapidly than the temperature of the substrate when power is first applied to the chip.

In what is known as flip-chip bonding, contacts on the front surface of the chip are typically provided with bumps of solder. The substrate has contact pads arranged in an array corresponding to the array of contacts on the chip. The chip, with the solder bumps, is inverted so that its front surface faces toward the top surface of the substrate, with each contact and solder bump on the chip being positioned on the appropriate contact pad of the substrate. The assembly is then heated so as to liquify the solder and bond each contact on the chip to the confronting contact pad of the substrate. Because the flip-chip arrangement does not require leads arranged in a fan-out pattern, it provides a compact assembly. The area of the substrate occupied by the contact pads can be approximately the same size as the chip itself. Moreover, the flip-chip bonding approach is not limited to contacts on the periphery of the chip. Rather, the contacts on the chip may be arranged in a so-called "area array" covering substantially the entire front face of the chip. Flip-chip bonding therefore is well suited to use with chips having large numbers of I/O contacts. Flip-chip structures using relatively small pillars or post structures on one or more of the chip or the substrate have been used to create a more robust and easy-to-assembly package. However, there are still size limitations regarding flip-chip, even with pillar or post structures because such bonding ordinarily requires that the contacts on the chip be arranged in an area array to provide adequate spacing for the solder bumps. Accordingly, flip-chip bonding normally cannot be applied to chips having rows of closely-spaced contacts, particularly when a distance is desired between the front face of the chip and the substrate that is greater than the pitch of the chip.

SUMMARY OF THE INVENTION

An embodiment of the present disclosure relates to an interconnection substrate. The substrate includes a plurality of electrically conductive elements of at least one wiring layer defining first and second lateral directions. Electrically conductive projections for bonding to electrically conductive contacts of at least one component external to the substrate, extend from the conductive elements above the at least one wiring layer. The conductive projections have end portions remote from the conductive elements and neck portions between the conductive elements and the end portions. The end portions have lower surfaces extending outwardly from the neck portions in at least one of the lateral directions. The substrate further includes a dielectric layer overlying the conductive elements and extending upwardly along the neck portions at least to the lower surfaces. At least portions of the dielectric layer between the conductive projections are recessed below a height of the lower surfaces.

The dielectric layer can be in the form of a solder mask. The recessed portions of the dielectric layer can be recessed at a distance of at least five microns below the lower surfaces of the conductive projections. The dielectric layer can fully cover the neck portions. The dielectric layer can fully cover the lower surfaces of the conductive projections or the dielectric layer can only partially cover the lower surfaces of the conductive projections.

The conductive projections can include a metal such as copper, copper alloy, aluminum, nickel, and gold or combinations thereof. Solder can be joined to at least the end portions of the conductive projections. The end portions of the projections can have end surfaces remote from the lower surfaces and edge surfaces extending between the lower surfaces and the end surfaces.

The recessed portions of the dielectric layer can define a first thickness above the wiring layer, and the end surfaces can be spaced above the wiring layer at a first height that is between 20 and 70 μm greater than the first thickness. Further, the conductive projections can be positioned along the wiring layer in an array in which they are spaced apart from each other at a pitch that is less than 200 μm. The recessed portions can define a first thickness above the wiring layer such that the end surfaces are spaced above the wiring layer at a first height that is at least 20 μm greater than the first thickness. The recessed portions can define recessed surfaces, and the lower surfaces of the end portions can be positioned above the recessed surfaces at a second height of at least 5 μm.

The substrate can further include a sheet like polymeric dielectric element, and the conductive elements can extend along the dielectric element. An element of the substrate, such as the dielectric layer, can have a CTE less than 8 ppm/° C. Such an element can be made from at least one of semiconductor, glass, or ceramic material.

The substrate can further include solder balls extending along at least the end portions of the conductive projections. The solder balls can define lower edges along the conductive projections that are spaced apart from the recessed portions by portions of the solder resist layer. A microelectronic assembly can include such a substrate in combination with a microelectronic element having a front face with contacts exposed thereon and a back face spaced apart from the front face. The first face of the microelectronic element can face the solder resist layer and the solder balls can be joined to respective ones of the contacts of the microelectronic element. Such an assembly can also include an underfill layer disposed between the front face of the microelectronic element and the substrate. The underfill layer can substantially surround edge surfaces of the solder balls and can extend along the recessed portions of the dielectric layer. The front face of the microelectronic element can be spaced apart from the recessed portions of the solder resist layer at a first distance, and the solder balls can define portions of a sphere having diameters that are less than the first distance. Such a microelectronic assembly can be used in diverse electronic systems with one or more other electronic components electrically connected to the microelectronic assembly.

An interconnection substrate according to another embodiment can include a plurality of electrically conductive elements of at least one wiring layer defining first and second lateral directions and electrically conductive projections having bonding surfaces for bonding to electrically conductive contacts of at least one component external to the substrate. The conductive projections extend from the conductive elements above the at least one wiring layer and the conductive projections have concave edge surfaces extending inwardly and downwardly from the bonding surfaces towards the conductive elements. The substrate also includes a dielectric layer overlying the conductive elements and extending along the concave edge surfaces, the dielectric layer between the conductive projections is recessed below a height of the bonding surfaces.

The bonding surfaces can meet the concave edge surfaces at a boundary, and the bonding surfaces and the concave edge surfaces together can form a continuous edge surface that changes direction abruptly at the boundary. Respective portions of the dielectric layer can extend along the concave edge surfaces to top edges near the boundary. The bonding surfaces can be convex. Portions of the dielectric layer can extend along the concave edge surfaces of the conductive projections to define concave edge surfaces of the dielectric layer portions.

Another embodiment of the present disclosure relates to a method for making a microelectronic substrate. The method includes forming a dielectric layer on an in-process unit including a wiring layer having a plurality of conductive elements extending in first and second lateral directions and a plurality of conductive projections extending away from the elements above the wiring layer. The conductive projections have end portions remote from the conductive elements and neck portions supporting the end portions between the conductive elements and the end portions. The end portions have lower surfaces extending outwardly from the neck portion in at least one of the lateral directions. The dielectric layer is formed on the neck portions and at least up to the lower surfaces. Portions of the dielectric layer are then removed to form recessed portions between the projections.

The step of removing portions of the dielectric layer can be carried out such that portions of the dielectric layer remain extending along the neck portions and contacting at least the lower surfaces. The dielectric layer can be a solder resist layer.

The step of removing portions of the dielectric layer can be carried out by a wet-blasting process. The wet-blasting process can be such that a mixture of abrasive particles in a liquid medium is directed toward selected areas of the dielectric layer. The abrasive particles can have a diameter of at least about 5 μm. The liquid medium can be a liquid having chemical etching properties. The wet-blasting process can include creating a directed flow of the mixture at a predetermined flow rate and passing the substrate through the directed flow at a predetermined velocity a predetermined number of times. The wet-blasting process can deform the end portions of the projections to define convex end surfaces thereon.

The neck portions of the projections can be formed before forming the dielectric layer, and the end portions of the projections can be formed after forming the solder resist layer and before removing portions of the solder resist layer.

The method can further include the step of depositing solder balls over at least the end portions of the projections. The solder balls can be spaced apart from the recessed portions of the solder resist layer by portions of solder resist layer extending along the neck portions. A method for making a microelectronic assembly can include making a microelectronic substrate by the above method and mounting a microelectronic element on the substrate. The microelectronic element can include a front surface having contacts thereon and a rear surface spaced apart from and substantially parallel to the front surface. The microelectronic element can be mounted to the substrate by joining the contacts to respective ones of the solder balls.

An alternative embodiment of a method for making a microelectronic substrate can include forming a dielectric layer on an in-process unit including a wiring layer having a plurality of conductive elements extending in first and second lateral directions and a plurality of conductive projections extending away from the elements above the wiring layer. The electrically conductive projections can have bonding surfaces for bonding to electrically conductive contacts of at least one component external to the substrate. The conductive projections can have concave edge surfaces extending inwardly and downwardly from the bonding surfaces toward the conductive elements, and the dielectric layer can overlie the conductive elements and extend along the concave edge surfaces. Portions of the dielectric layer are then removed to form recessed portions between the projections. The step of removing portions of the dielectric layer can be carried out such that portions of the dielectric layer remain extending along the concave edge surfaces to a boundary formed between the edge surface and the bonding surface. Removing portions of the dielectric layer can further be carried out by a wet-blasting process. The wet-blasting process can deform the bonding surfaces the projections to define convex surfaces thereon. The wet-blasting process can further deform the bonding surfaces such that a periphery of the bonding surface widens along at least a portion thereof.

BRIEF DESCRIPTION OF THE DRAWINGS

FIGS. 12-14 show a connection substrate, such as that of FIG. 9 during various stages of a method of fabrication thereof;

DETAILED DESCRIPTION

Figure 1A:
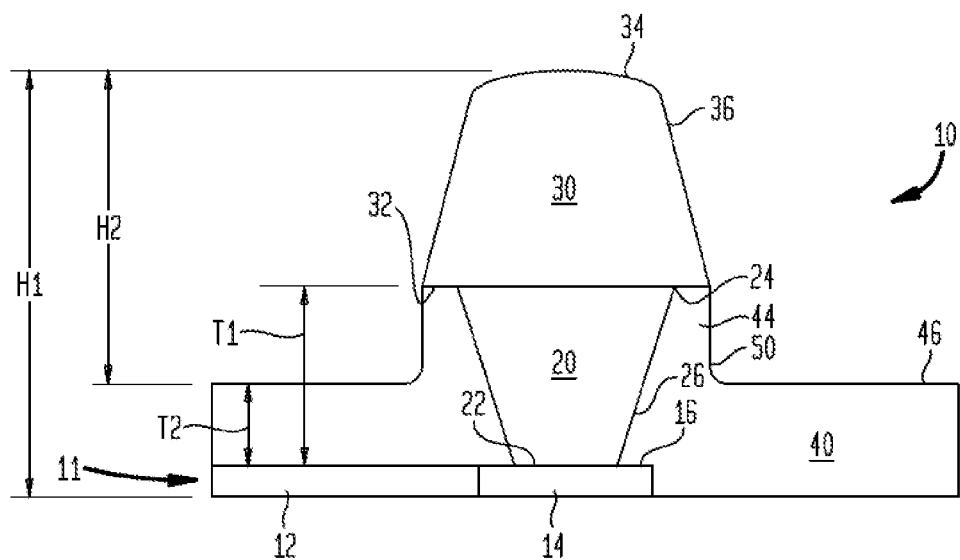
FIG. 1A shows a portion of a connection substrate according to an embodiment of the present disclosure.
Figure 1B:
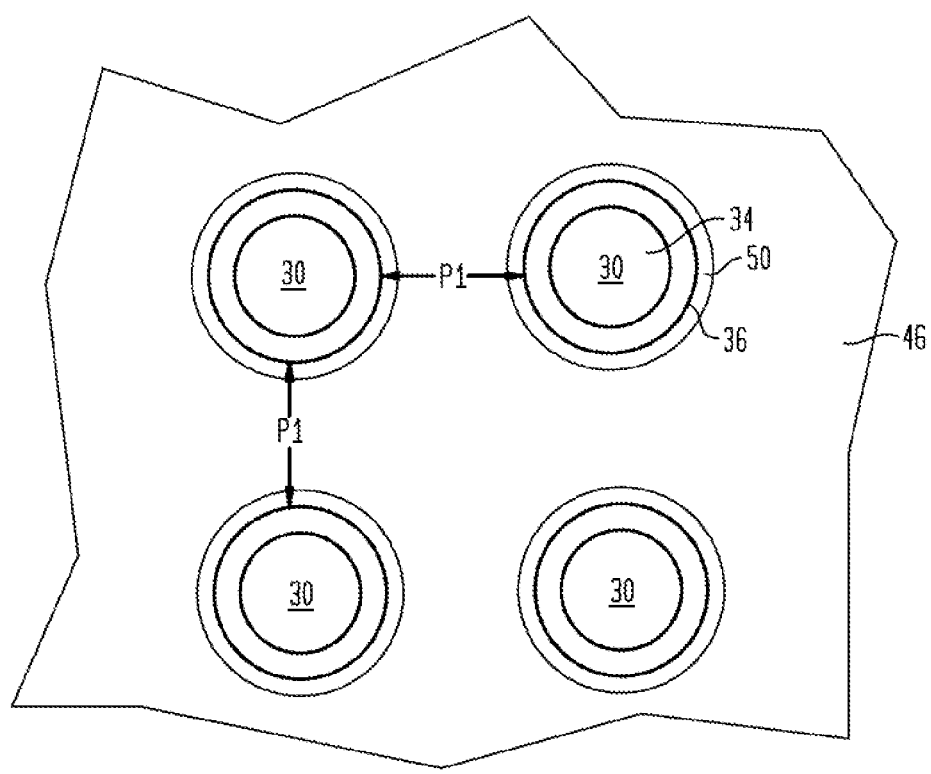
FIG. 1B is a top plan view of a portion of the connection substrate of FIG. 1.

Turning now to the drawings, where similar numeric references are used to indicate corresponding features, FIG. 1 shows a portion of a substrate 10 according to an embodiment of the present disclosure. Substrate 10 includes a wiring layer 11 with conductive features formed therein which can be used for electrical connections through and within substrate 10. These conductive features can include conductive pads 14 and traces 12, which can be electrically connected with conductive pads 14. A dielectric layer 40 overlies wiring layer 11 and gives support thereto. Dielectric layer 40 can be structured such that wiring layer 11 can extend along a substantially planar surface thereof and can overly such a surface. In one embodiment, wiring layer 11 can be partially or fully embedded within dielectric layer 40.

A conductive projection 18 of substrate 10 can extend in a direction above a conductive feature of wiring layer 11, such as from surface 16 of pad 14. Conductive projection 18 extends away from pad 14 and wiring layer 11 to an end surface 34 that defines a height H1 for projection 18 above wiring layer 11. Projection 18 includes a neck portion and an end portion 30. Neck portion 20 is positioned adjacent to pad 14 and includes base 22 of projection 18. End portion 30 includes a lower surface 32 that is spaced away from base 22 by neck portion 20 such that neck portion 20 extends to a corner 24 that substantially defines the upper end of neck portion 20. Neck edge surface 26 extends from base 22 to corner 24 and defines an outer periphery of neck 20. The end portion 30 has a surface 36 extending away from the lower surface 32. As seen in FIG. 1, end portion 30 may have an end surface 34 and an end edge surface 36 extending between lower surface 32 and end surface 34 so as to define an outer periphery of end portion 30. Alternatively, the end portion 30 may present a continuous surface extending continuously from the lower surface 32 to end portion 30.

As shown in FIG. 1, at least part of neck portion 20 is narrower than at least a part of end portion 30. In the embodiment shown, end portion 30 is wider where end edge surface 36 meets lower surface 32 such that lower surface 32 extends beyond neck edge surface 24 with lower surface 32 substantially facing wiring layer 11. FIG. 1 shows neck portion tapering such that it is narrower at base 22 than at corner 24, however other arrangements are possible including one in which neck portion is substantially of a uniform diameter or in which it tapers from a greater width at base 22 to a lesser width at corner 24. End portion 24 can taper from a greater thickness where end edge surface 36 meets lower surface 32 to a lesser thickness at end surface 34, however end portion 24 could be of a substantially uniform thickness.

The conductive elements of wiring layer 11, including traces 12 and pads 14, as well as projections 18 can be formed from an electrically conductive material. Such conductive materials can include copper, gold, nickel, aluminum, or various alloys comprising mixtures thereof. Additionally, the features within wiring layer 11 can be made of a different material than that of projections 18.

Dielectric layer 40 extends in lateral directions defined by wiring layer 11 substantially over all of wiring layer 11. Dielectric layer 40 has a thickness T1 over first portions 44 thereof such that at least first surface portions 48 are substantially even with lower surfaces 32 of posts 18. Dielectric layer 40 includes portions thereof that extend along neck edge surfaces 26 and substantially surround neck portion 20. First surface portions 48 are formed on first portions 44 such that they extend along lower surfaces 32 of end portions 30 with end edge surfaces 36 and end surfaces 34 uncovered by dielectric layer 40.

Recessed portions 42 are included in dielectric layer 40 and define recessed surfaces 46 therein that are spaced closer to wiring layer 11 than first surface portions 48. Accordingly, within recessed portions 42, dielectric layer has a thickness T2 that is less than thickness T1. In an embodiment, T2 is less than T1 by at least about 5 µm. Further, first portions 48 of dielectric layer. Dielectric edge surfaces 50 extend at least partially between first surface portions 48 and recessed portions 42 and can define a boundary between first portions 44 and recessed portions 42. Further, first portions 48 can be positioned generally beneath lower surfaces 32 or can be positioned generally between corresponding pads 14 and lower surfaces 32. A transition surface 52 can extend between recessed surfaces 46 and dielectric edge surfaces 50 and can be positioned outside of lower surfaces 32. By including recessed portions 42 with reduced thicknesses T2 in dielectric layer 40, conductive projections have a height H2 above recessed portions 42 that become effective projection heights above dielectric layer 40. In an embodiment, H2 can be between about 20 and 70 µm. In another embodiment, H2 can be at least about 20 µm.

Figure 2:
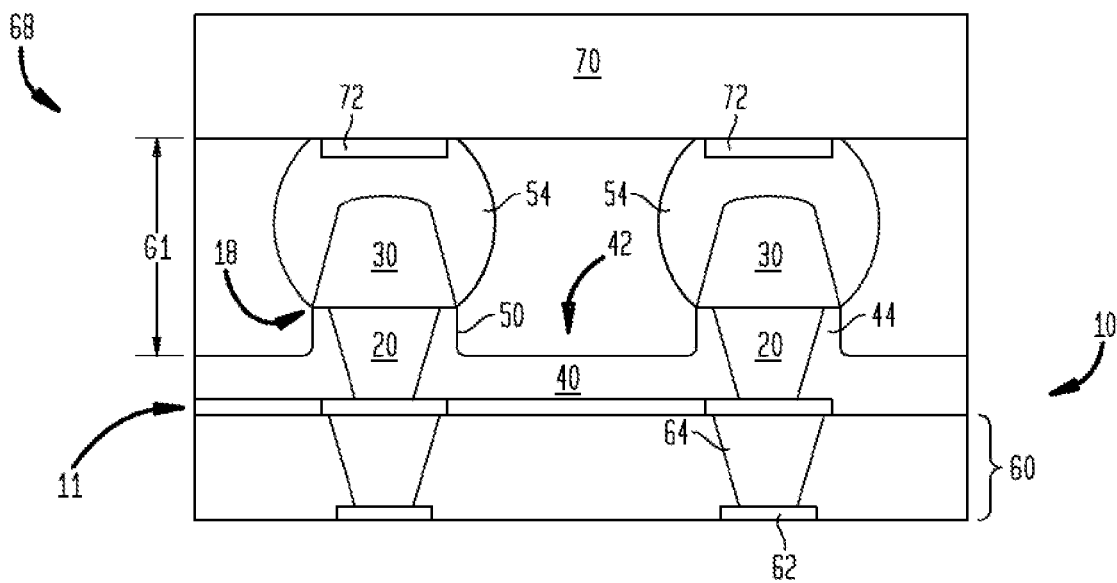
FIG. 2 shows a portion of a microelectronic package including the connection substrate of FIG. 1.

Projections 18 can be used to form connections in microelectronic packages. For example, projections 18 can be used to connect a microelectronic element 70, which can be in the form of a microchip or the like, to substrate 10 such that projections 18 provide an electric connection between microelectronic element 70 and wiring layer 11, thereby forming a microelectronic assembly 68. A portion of such a microelectronic assembly 68 is shown in FIG. 2, but an embodiment of a full assembly including an enlarged substrate 60 according to an embodiment of the disclosure is shown in FIG. 14. As shown in FIG. 2, microelectronic element can include contact pads 72 thereon that are exposed on a front surface 74 thereof. Microelectronic element 70 can be flip-chip bonded to substrate 10 by solder balls bonded between respective projections 18 and contact pads 72. In such a structure, a gap G1 is formed between front face 74 of microelectronic element 70 and recessed surfaces 46 of dielectric layer 40. An underfill layer 76 can be between the front surface 74 of microelectronic element 70 and substrate within gap G1. Underfill layer 76 can extend along portions of surface 74 exposed between solder balls 74 as well as the edges of solder balls 54 and along dielectric edge surfaces 50 and along recessed surfaces 44. Underfill layer 76 can be formed from a curable polymeric material.

Figure 3:
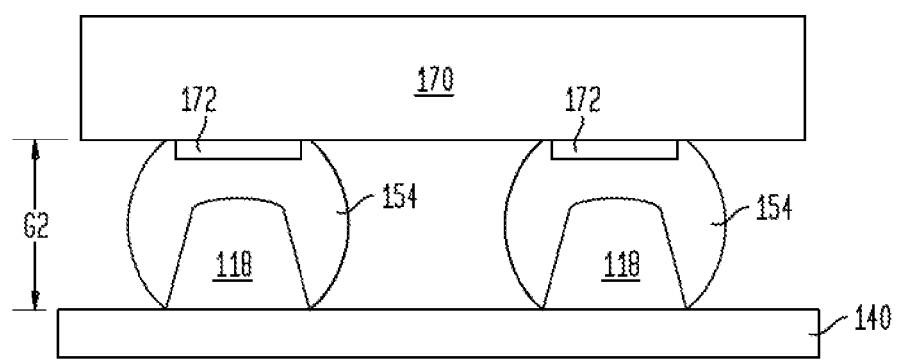
FIG. 3 shows an alternative embodiment of a connection substrate.

Dielectric layer 40 can be formed from a solder mask layer such that solder balls 54, when formed on projections 18 or when re-flowed during assembly, do not wick or otherwise contact or extend along substantial portions of dielectric edge surfaces 50 and remain out of contact with recessed surfaces 46. In such an embodiment, solder balls 54 extend only along end surfaces 34 and end edge surfaces 36. Accordingly, a connection structure including a solder ball 54 having a diameter of D1 can be formed that allows for a gap G1 that is greater than the gap G2 which could be achieved in an arrangement (FIG. 3) in which surface 148 of dielectric layer has no recesses. Because solder tends to form substantially spherical edge surfaces when deposited or reflowed due to the surface tension of the metal when melted, increasing post height has resulted in a larger overall solder ball with a correspondingly increased diameter. However, as shown in FIG. 2, a post structure can be provided with a greater effective height H2 than that of FIG. 3, which can result in a greater gap G1, compared to the gap G2 (FIG. 3) with a solder ball 54 that is of a comparable diameter D1. Accordingly, projections 18 can be spaced apart form each other at a pitch P1 (shown in FIG. 1B) that is comparable to the pitch allowed only by shorter projections in the FIG. 3 arrangement. In an embodiment, the pitch P1 can be less than about 200 μm.

As also shown in FIG. 2, substrate 10 can be in the form of a multilayer substrate that includes, for example, a further dielectric layer 82 beneath wiring layer 11 and dielectric layer 40. Dielectric 82 can support any additional wiring layers 62 having pads or traces or a combination thereof. Although only a single layer of traces 84 are shown in FIG. 2, a greater number of wiring layers of is possible. Such layers can be connected by conductive vias 64 or the like, which are shown in FIG. 2 connecting wiring layer 62 to pads 14.

Figure 4:
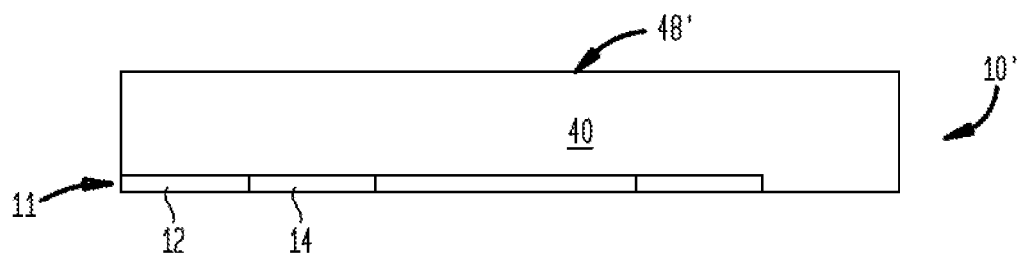
FIGS. 4-8 show a connection substrate such as that of FIG. 1 during various stages of a method of fabrication thereof.

FIGS. 4-8 illustrate steps in forming a substrate 10 according to the embodiments shown in FIGS. 1 and 2. As shown in FIG. 4, an in-process unit 10' is shown as a layer of dielectric material 40, which is can be a solder-mask layer, as described above. Wiring layer 11, including conductive traces 12 and conductive pads 14 is formed extending along a surface of the dielectric layer 40. In-process unit 10' can be formed, for example, by etching the features of wiring layer 11 from a layer of metal that is either formed on top of a carrier or on lower layers of a multilayer substrate, as described with respect to FIG. 2, although only in-process unit 10' is illustrated herein. Alternatively, a similar wiring layer can be formed by etching a metal layer or by direct plating on a surface of a dielectric layer.

Figure 5:
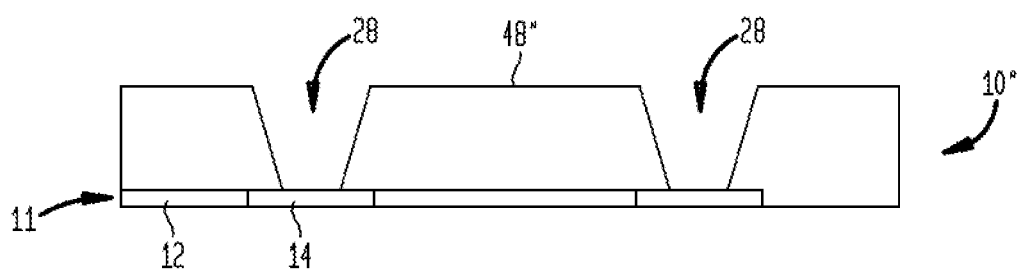

In FIG. 5, a plurality of holes 28 are formed in dielectric layer 40. Holes 28 can be formed by photo-etching using a mask or resist layer, or can be formed by laser etching, chemical etching or the like. Holes 28 are formed over pads 14 or otherwise in the desired location for conductive projections 18 to be formed later for electrical connection to a feature above the resulting substrate 10. Holes 28 expose at least a portion of pads 14 for access thereto.

Figure 6:
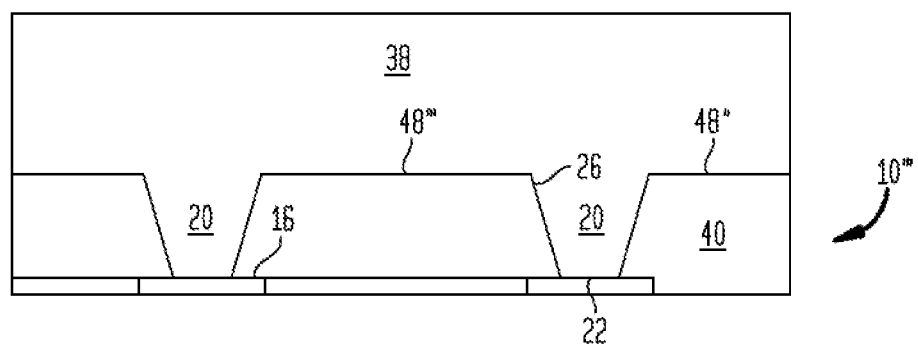

In FIG. 6, a plating layer 38 is formed over the first surface 48' of dielectric layer 40 and within holes 28. Layer 38 can be formed by plating copper until the proper thickness is built up over surface 41 and holes 28 are filled. Portions of layer 38 form neck portions 20 within holes 28, including bases 22 along portions of layer 38 that contact and are bonded to pads 14. Neck edge surfaces 26 are formed along the portions of dielectric layer 40 that define holes 28 such that dielectric layer 40 extends along neck edge surfaces 26. A lower surface 32' of plating layer 38 is formed along first surface 48'''.

Figure 7:
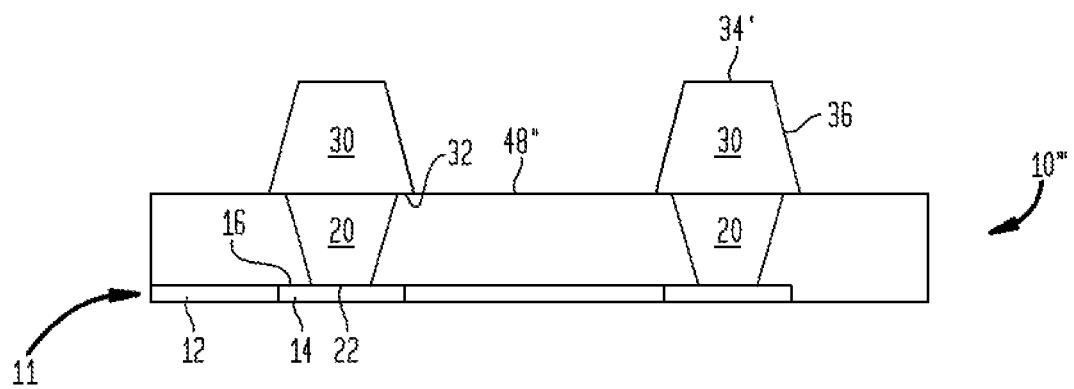

As shown in FIG. 7, plating layer 38 is then selectively etched, using chemical etching or the like to form end portions 30' for conductive projections 18. In the etching process areas of plating layer 38 are removed outside of selected areas thereof that correspond to pads 14 and the neck portions 20 formed thereon in the step shown in FIG. 6. Plating layer 38 is removed in the selected areas such that surface 48' of dielectric layer is exposed between end portions 30'. Further, end portions 30' are formed such that portions of surface 32' of plating layer 38 remain extending outward from neck edge surfaces 26 along portions of surface 48'.

Figure 8:
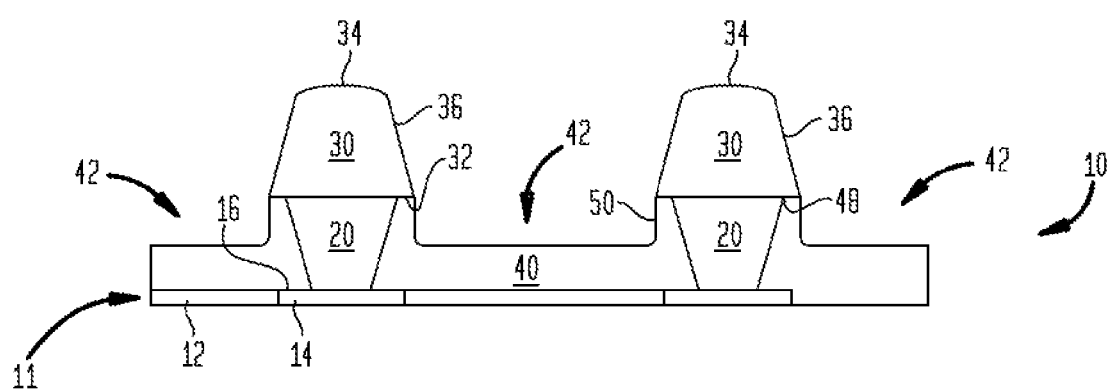

Recessed portions 42 are formed in dielectric layer 40 resulting in the structure of FIG. 8. Recessed portions 42 are structurally described above with respect to FIG. 2, and, in one embodiment, can be formed using a wet blasting process. Wet blasting is a mechanical etching process that uses a high-pressure, focused liquid flow directed at the substrate 10' to remove material therefrom. In a particular embodiment, the liquid medium can include an etchant which may help to etch or remove portions of the dielectric layer selectively relative to metal which is exposed to the flow. Wet-blasting can be performed in a selective manner such that the process reduces a thickness of the dielectric layer 40 selectively relative to the end portions 30 without requiring the use of a mask layer or similar structure. Wet-blasting can also be carried out after the application of a mask layer over, for example, the ends 30 of projections 18 or over areas of the dielectric layer 40 where recesses are not desired. Further, wet-blasting can be carried out in a non-selective manner over the entire substrate, relying on the differences in hardness of the various structures to create the desired structures. The wet-blasting process removes material in the area of recessed portions 42 over time and is carried out until the desired thickness T2 is reached for the areas of dielectric layer 40 within recessed portions 42. During the wet blasting operation, end portions 30 can become deformed, including for example, rounding at the periphery of end surface 34 or the like, or material can be removed therefrom; however, such deformation can be less than that of dielectric layer 40, leaving end portions 30 substantially intact. The portions of dielectric layer 40 that are disposed beneath lower surfaces 32 are substantially protected from the wet blasting and are, accordingly, also left surrounding neck portions 20.

Wet-blasting can be carried out, for example, using a slurry or mixture of abrasive particles in a liquid medium. The abrasive particles can be similar to those that can be used in sand blasting or bead blasting and can have a diameter of at least about 5 μm. The liquid medium can be water or can be a chemical or chemical mixture. Such chemicals or mixtures can include chemical etchants or solder mask strip chemicals. The liquid medium can also include additives for pH control or other properties. Sand blasting or bead blasting, with no liquid medium, can also be used as alternatives to the wet-blasting process.

Depending upon the particle characteristics and density within the medium, the amount of time the substrate is exposed to the flow can be adjusted to attain the depth of recess desired. These parameters may also be adjusted to attain projections having a desired shape, e.g., extent to which the end surfaces overhang the edge surfaces.

Portions of first surface 48 are also left extending along at least some of lower surfaces 32. This step also results in the formation of dielectric edge surfaces 50 that extend beneath end edge surfaces 36. Recesses 42 can also be formed by other reductive processes, such as mechanical or chemical etching. A Saw or laser can be used to form the recesses between end portions by moving over the dielectric layer 40 in two transverse directions over several passes through the desired area for recesses 42. In this case, the recesses may not be aligned with the edges 36 of the end portions 30, but may instead be spaced apart therefrom.

The substrate 10 formed by the described steps can then be used to form a packaged microelectronic element as shown in FIG. 2. An underfill layer 76 can be formed between front surface 74 of microelectronic element 70 and recessed surfaces 46 and surrounding solder balls 54 and dielectric edge surfaces 50. The wet blasting process can result in a roughness on surfaces 46 and 50 such that underfill adherence is improved compared to that of, for example an un-blasted surface such as surface 48.

Figure 9:
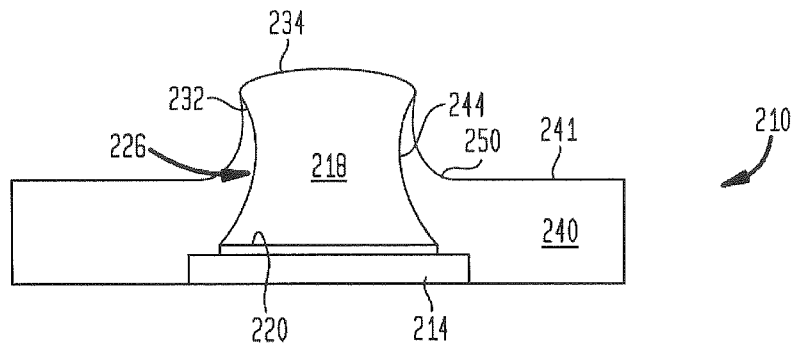
FIG. 9 shows a portion of a connection substrate according to an alternative embodiment of the present disclosure.
Figure 10:
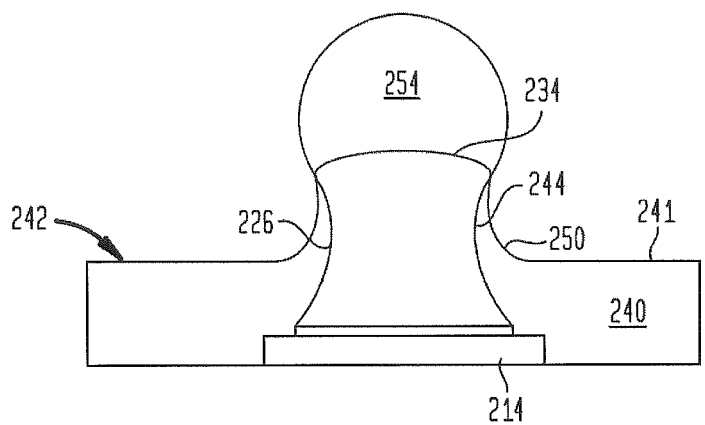
FIG. 10 shows a portion of the connection substrate of FIG. 9 having a bonding element joined thereto.

In a variation of the above embodiment, substrate 210 can have conductive projections 218, as shown in FIGS. 9 and 10. Substrate 210 includes conductive projections 218 having concave edge surfaces 226 disposed between bases 220 and convex end surfaces 234. The concave edge surfaces may extend continuously between the bases 220 and the end surface 234. Edge surfaces 226 can be such that upper portions 232 thereof extend outwardly and at least partially face toward wiring layer 211. Dielectric layer 240 extends along edge surface 226, including along upper portion 232 thereof and includes recessed portions 242 formed therein. Recessed portions 242 define recessed surfaces 246 along bottom portions thereof wherein dielectric layer 40 has a thickness T2. First portions 244 of dielectric layer 240 are positioned at least partially below convex end surfaces 234 within the convex area defined by convex edge surfaces 236, including below the upper portion 236 thereof. First portions 244 define dielectric edge surfaces 250 that extend substantially downward from end surface 236 and transition to recessed surfaces 246.

Figure 11:
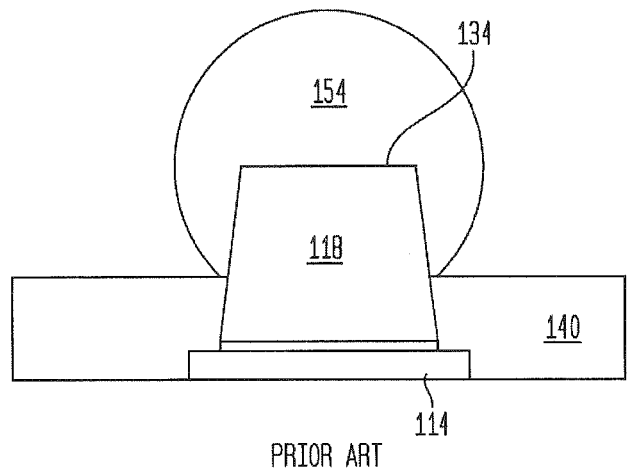
FIG. 11 shows a portion of an alternative connection substrate.

As described above with respect to FIG. 2, dielectric layer 240 can be made from a solder mask material such that solder balls 254 that are formed on projections 218 do not extend along dielectric edge surfaces 250 and do not contact recessed surfaces 246. As shown in a comparison of the embodiment of FIG. 10 to the prior-art structure depicted in FIG. 11, a solder ball having a smaller diameter D2 can be formed over projection 218 than over the projection 118 of the prior art because the solder does not wick downward. Accordingly, multiple projections 218 can be formed in an array having a smaller pitch than would be possible in the structure shown in FIG. 11 of a projection having the same hight H3.

FIGS. 12-14 show substrate 210 in various forms during sequential steps for fabrication thereof. In FIG. 12, projections 218' are formed on pads 14 that are formed on a lower layer 60 that will form a multilayer substrate structure, although other substrate arrangements for packaged microelectronic structures are possible. Projection 218' is shown as an etch post formed from one layer of a tri-metal layer including an etch-stop layer 223, however, alternative structures can be used, such as that shown for end portion 230 of projection 18 in FIG. 1. In an embodiment layer 60 can be a sheet-like polymeric element. In a further embodiment, layer 60 can be of a material having a low coefficient of thermal expansion ("CTE") such as of about 8 parts per million per ° C. ("PPM/° C.") or less. Such materials can include certain types of semi-conductor materials, glass, or ceramic.

In FIG. 13 dielectric layer 240' is formed over layer 260 and over any exposed portions of pad 14 and upward along edge surface 226 of projection 218'. End surface 234' can be left exposed on surface 248' of dielectric layer. Subsequently a wet-blasting process, as described with respect to FIG. 8 is applied to substrate 210' to remove portions of dielectric layer 240' between projections 218' and in the desired area for recessed portions 242. Because the material of dielectric layer 240' is softer than the material of posts 218', the wet-blasting process removes material at a faster rate from dielectric layer 240' than from projections 218'. Accordingly, as the process begins, portions of edge surface 226' can become exposed over dielectric layer 240'. The exposure of portions of edge surface 226' can allow for deformation of projections 218', including the formation of a convex shape for end surface 234 and an increase in the degree of the concave shape for edge surface 226 as upper portion 232 thereof is pushed outward in the exposed area thereof over dielectric layer 240. Some removal of material from projections 218 can also occur during this process. As the wet-blasting process continues, upper portion 232 of edge surface can extend outwardly over a portion 244 of dielectric layer 240, further shielding that portion 244 from further effects of wet-blasting. Accordingly, the structure of FIG. 14 can result in which portions of dielectric layer 244 surround projections 18 beneath end surfaces 234 and extending along edge surfaces 226.

Figure 15:
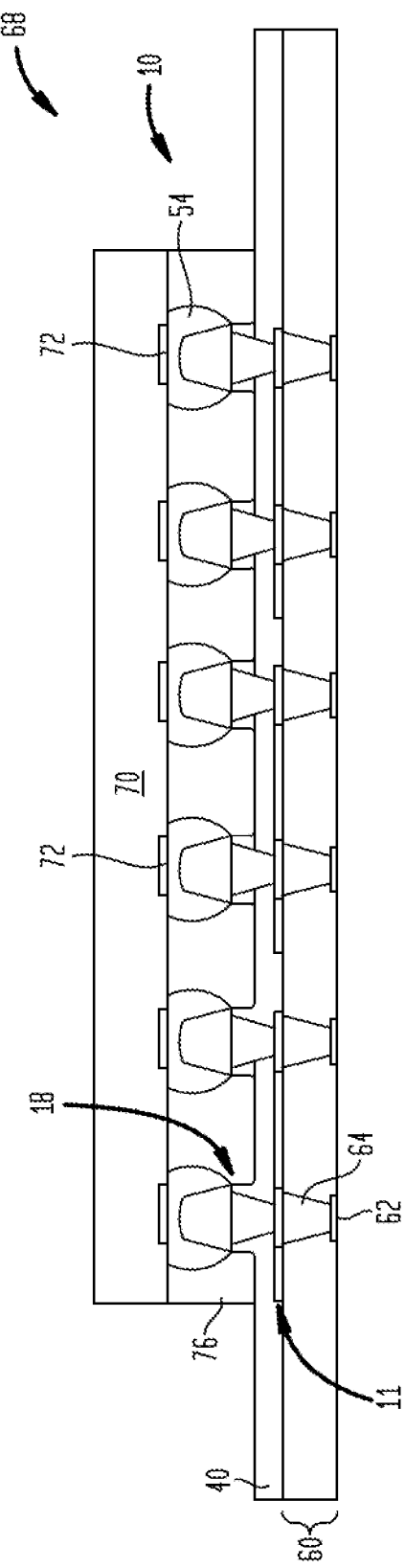
FIG. 15 shows a microelectronic assembly including a substrate similar to that of FIG. 1.
Figure 16:
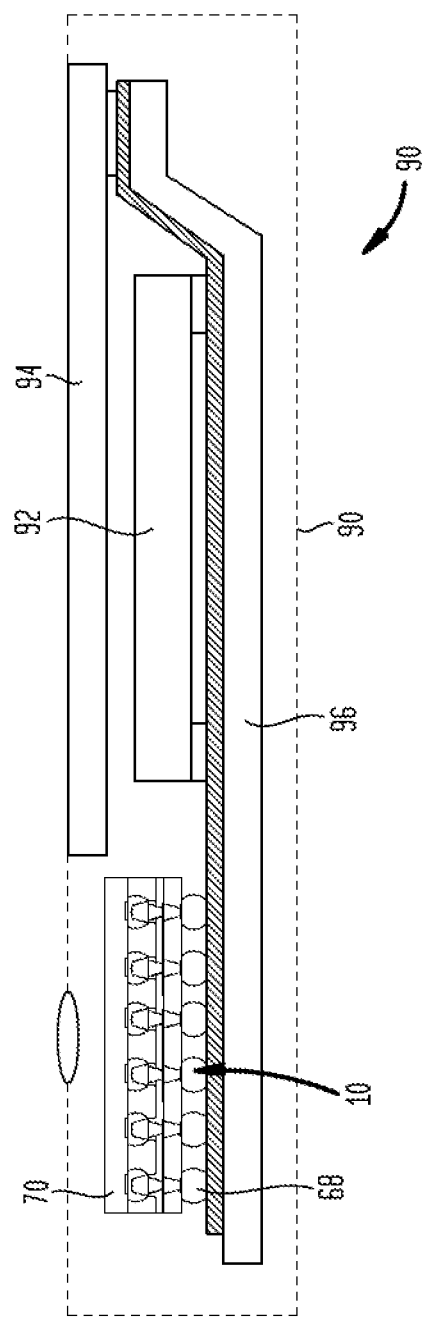
FIG. 16 shows an electronic system including a microelectronic assembly having a substrate similar to that of FIG. 15.

The interconnection components described above can be utilized in construction of diverse electronic systems, as shown in FIG. 15. For example, a system 90 in accordance with a further embodiment of the invention can include a microelectronic assembly 68, being a unit formed by assembly of a microelectronic element 70 on substrate 10, similar to the microelectronic assembly 68 shown in FIG. 14 The embodiment shown, as well as other variations of the interconnection component or assemblies thereof, as described above can be used in conjunction with other electronic components 92 and 94. In the example depicted, component 92 can be a semiconductor chip or package or other assembly including a semiconductor chip, whereas component 94 is a display screen, but any other components can be used. Of course, although only two additional components are depicted in FIG. 15 for clarity of illustration, the system may include any number of such components. In a further variant, any number of microelectronic assemblies including a microelectronic element and an interconnection component can be used. The microelectronic assembly and components 92 and 94 are mounted in a common housing 91, schematically depicted in broken lines, and are electrically interconnected with one another as necessary to form the desired circuit. In the exemplary system shown, the system includes a circuit panel 96 such as a flexible printed circuit board, and the circuit panel includes numerous conductors 98, of which only one is depicted in FIG. 14, interconnecting the components with one another. However, this is merely exemplary; any suitable structure for making electrical connections can be used, including a number of traces that can be connected to or integral with contact pads or the like. Circuit panel 96 can have contacts 52 thereon, and can connect to interconnection component 2 using solder balls 32 or the like. The housing 91 is depicted as a portable housing of the type usable, for example, in a cellular telephone or personal digital assistant, and screen 94 is exposed at the surface of the housing. Where structure 90 includes a light-sensitive element such as an imaging chip, a lens 99 or other optical device also may be provided for routing light to the structure. Again, the simplified system 90 shown in FIG. 14 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An interconnection substrate, comprising:
   a plurality of electrically conductive elements of at least one wiring layer defining first and second lateral directions;
   electrically conductive projections having bonding surfaces for bonding to electrically conductive contacts of at least one component external to the substrate, the conductive projections extending from the conductive elements above the at least one wiring layer, the conductive projections having concave edge surfaces extending inwardly and downwardly from the bonding surfaces towards the conductive elements; and
   a solder resist layer extending along exposed surfaces of the conductive elements and extending along the concave edge surfaces so as to prevent a bonding metal from wicking away from the bonding surfaces and inwardly and downwardly along the concave edge surfaces, the solder resist layer between the conductive projections being recessed below a height of the bonding surfaces.

2. The interconnection substrate of claim 1, wherein the bonding surfaces meet the concave edge surfaces at a boundary, and wherein the bonding surfaces and the concave edge surfaces together form a continuous edge surface that changes direction abruptly at the boundary.

3. The interconnection element of claim 2, wherein the solder resist layer is disposed at the boundary.

4. The interconnection substrate of claim 2, wherein respective portions of the solder resist layer extend along the concave edge surfaces to top edges near the boundary.

5. The interconnection substrate of claim 4, wherein portions of the solder resist layer extending along the concave edge surfaces of the conductive projections define concave edge surfaces of the solder resist layer portions.

6. The interconnection substrate of claim 1, wherein the bonding surfaces are convex.

7. The interconnection substrate of claim 1, wherein upper portions of the concave edge surfaces extend outwardly and at least partially face toward the wiring layer.

8. The interconnection substrate of claim 1, further including solder balls extending along at least the bonding surfaces of the conductive projections, and wherein the solder balls define lower edges along the conductive projections and spaced apart from the recessed portions by portions of the solder resist layer.

9. A microelectronic assembly, comprising:
   the interconnection substrate of claim 8; and
   a microelectronic element having a front face with contacts exposed thereon and a back face spaced apart from the front face,
   wherein the first face of the microelectronic element faces the solder resist layer and wherein the solder balls are joined to respective ones of the contacts of the microelectronic element.

10. The microelectronic assembly of claim 9, wherein the front face of the microelectronic element is spaced apart from the recessed portions of the solder resist layer at a first distance, and wherein the solder balls define portions of a sphere having diameters that are less than the first distance.

11. The microelectronic assembly of claim 10, wherein an encapsulant extends between the solder resist layer and the front face of the microelectronic element.

12. A method for making a microelectronic substrate, comprising the steps of:
   forming a solder resist layer on an in-process unit including a wiring layer having a plurality of conductive elements extending in first and second lateral directions and a plurality of conductive projections extending away from the elements above the wiring layer, the electrically conductive projections having bonding surfaces for bonding to electrically conductive contacts of at least one component external to the substrate, the conductive projections having concave edge surfaces extending inwardly and downwardly from the bonding surfaces towards the conductive elements, the solder resist layer extending along exposed surfaces of the conductive elements and extending along the concave edge surfaces so as to prevent a bonding metal from wicking away from the bonding surfaces and inwardly and downwardly along the concave edge surface; and
   removing portions of the solder resist layer to form recessed portions between the projections.

13. The method of claim 12, wherein the step of removing portions of the solder resist layer is carried out such that portions of the solder resist layer remain extending along the concave edge surfaces to a boundary formed between the edge surface and the bonding surface.

14. The method of claim 12, wherein the bonding surfaces are convex.

15. The method of claim 12, wherein the step of removing portions is carried out such that the solder resist layer is positioned at least partially below the bonding surfaces.

16. The method of claim 12, wherein the step of removing portions of the solder resist layer is carried out by a wet-blasting process.

17. The method of claim 16, wherein the wet-blasting process deforms the bonding surfaces the projections to define convex surfaces thereon.

18. The method of claim 16, wherein the wet-blasting process further deforms the bonding surfaces such that a periphery of the bonding surface widens along at least a portion thereof.

* * * * *